(12) United States Patent
Özer et al.

(10) Patent No.: US 11,587,386 B1
(45) Date of Patent: Feb. 21, 2023

(54) METHODS AND APPARATUS FOR ELECTRONIC VOTING

(71) Applicant: Arm Limited, Cambridge (GB)

(72) Inventors: Emre Özer, Buckden (GB); James Edward Myers, Bottisham (GB); Jedrzej Kufel, Littleport (GB); John Philip Biggs, Cambridge (GB); Remy Pottier, Grenoble (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/390,436

(22) Filed: Jul. 30, 2021

(51) Int. Cl.
| | | |
|---|---|---|
| *G06K 19/02* | (2006.01) | |
| *G07C 13/02* | (2006.01) | |
| *G06K 19/077* | (2006.01) | |
| *G06K 7/08* | (2006.01) | |
| *H05K 1/16* | (2006.01) | |
| *H05K 1/03* | (2006.01) | |
| *H05K 3/12* | (2006.01) | |
| *G06Q 90/00* | (2006.01) | |

(52) U.S. Cl.
CPC ............ *G07C 13/02* (2013.01); *G06K 7/086* (2013.01); *G06K 19/025* (2013.01); *G06K 19/07707* (2013.01); *G06K 19/07722* (2013.01); *G06Q 90/00* (2013.01); *H05K 1/0393* (2013.01); *H05K 1/16* (2013.01); *H05K 3/125* (2013.01); *G06Q 2230/00* (2013.01); *H05K 2201/10098* (2013.01)

(58) Field of Classification Search
CPC ...... G07C 13/02; G06K 7/086; G06K 19/025; G06K 19/07707; G06K 19/07722; G06Q 90/00; G06Q 2230/00; H05K 1/0393; H05K 1/16; H05K 3/125; H05K 2201/10098
See application file for complete search history.

(56) References Cited

U.S. PATENT DOCUMENTS

2006/0151602 A1\* 7/2006 Hawkins ................ B41J 3/445
235/386

\* cited by examiner

*Primary Examiner* — Jamara A Franklin
(74) *Attorney, Agent, or Firm* — Nixon & Vanderhye P.C.

(57) ABSTRACT

Aspects of the present disclosure relate to an apparatus comprising: a substrate; communication circuitry deposited on said substrate; and ballot circuitry deposited on said substrate. The ballot circuitry comprises: a plurality of voting circuitry elements, each voting circuitry element being responsive to a voting operation to change a conductive state of that voting circuitry element; and logic circuitry communicatively coupled with each of the plurality of voting circuitry elements and with the communication circuitry. The logic circuitry is configured to: detect the conductive state of each of the plurality of voting circuitry elements; and transmit, via the communication circuitry and based on the conductive state of each of the plurality of voting circuitry elements, a voting result.

19 Claims, 5 Drawing Sheets

METHODS AND APPARATUS FOR ELECTRONIC VOTING

BACKGROUND

The present technique relates to the field of apparatuses for facilitating electronic voting.

Historically, voting (for example in elections) was typically performed using paper ballot sheets, on which a voter makes a mark next to their preferred option. In many situations, paper voting has been supplanted by electronic voting. For example, government elections in many countries are held using electronic voting methods.

Various electronic voting methods exist, and generally they allow a faster counting process than paper ballots. However, they often require complex infrastructure such as voting terminals or smartcard readers. There are also concerns around the possibility that electronic systems could be vulnerable to malicious attacks, presenting a potential risk of election fraud via modification of votes, as well as reducing public trust in an electoral system.

There is therefore a desire for improved electronic voting systems.

SUMMARY

At least some examples provide an apparatus comprising:
a substrate;
communication circuitry deposited on said substrate; and
ballot circuitry deposited on said substrate, the ballot circuitry comprising:
  a plurality of voting circuitry elements, each voting circuitry element being responsive to a voting operation to change a conductive state of that voting circuitry element; and
  logic circuitry communicatively coupled with each of the plurality of voting circuitry elements and with the communication circuitry, the logic circuitry being configured to:
    detect the conductive state of each of the plurality of voting circuitry elements; and
    transmit, via the communication circuitry and based on the conductive state of each of the plurality of voting circuitry elements, a voting result.

Further examples provide a method comprising:
depositing communication circuitry onto a substrate; and
depositing ballot circuitry onto said substrate, wherein depositing the ballot circuitry comprises:
  depositing a plurality of voting circuitry elements onto the substrate, each voting circuitry element being responsive to a voting operation to change a conductive state of that voting circuitry element; and
  depositing logic circuitry onto the substrate, the logic circuitry being communicatively coupled with each of the plurality of voting circuitry elements and configured to:
    detect the conductive state of each of the plurality of voting circuitry elements; and
    transmit, via the communication circuitry and based on the conductive state of each of the plurality of voting circuitry elements, a voting result.

Further examples provide a method comprising:
obtaining an apparatus as described above, a voting operation having been applied to said apparatus; and
communicating with the apparatus, via the communication circuitry, to receive a voting result from the logic circuitry.

Further aspects, features and advantages of the present technique will be apparent from the following description of examples, which is to be read in conjunction with the accompanying drawings.

DESCRIPTION OF EXAMPLES

Figure 1:
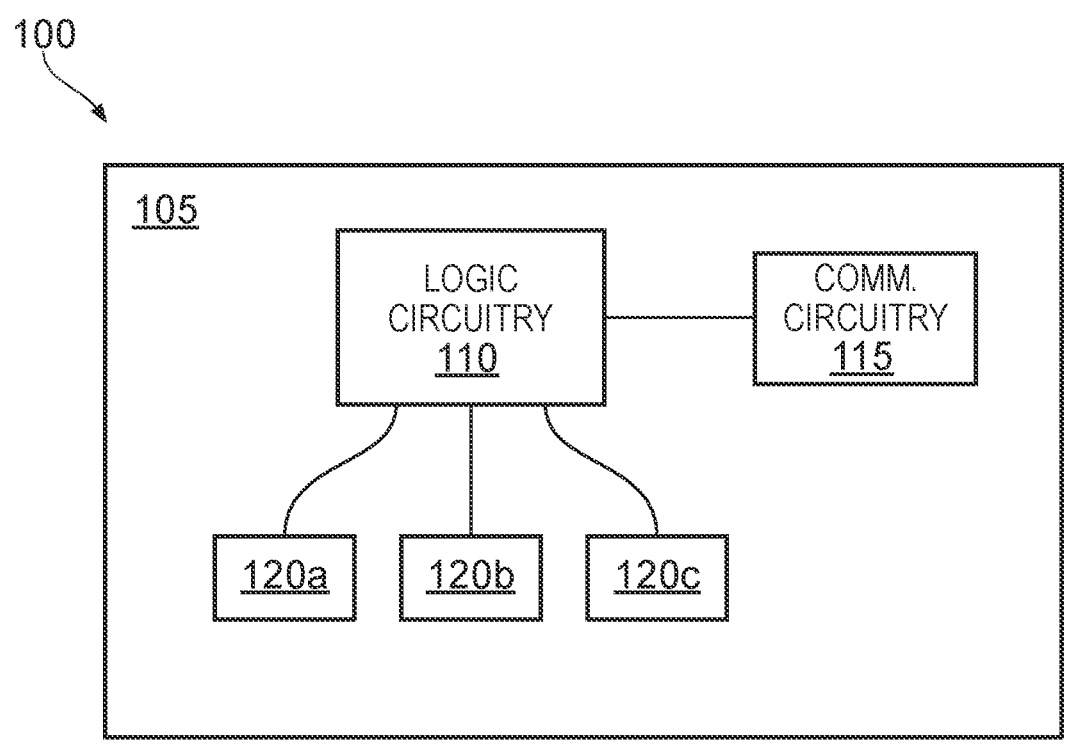
FIG. 1 schematically depicts an apparatus according to an example.

One apparatus of the present disclosure relates to an apparatus for facilitating voting. The apparatus may for example be a ballot apparatus, provided to a voter, to allow them to cast a vote.

The apparatus comprises a substrate, with communication circuitry and ballot circuitry being deposited on the substrate. This deposition may for example be via printing, such as inkjet printing with conductive ink, such that the electronics are printed electronics. This provides an efficient way of depositing the circuitry.

The substrate may be a flexible substrate, with the electronics being flexible electronics. For example, the substrate may be paper or plastic. This allows the apparatus to be robust and portable, as well as conforming to a form factor which resembles a traditional paper ballot and is thus familiar to voters, facilitating ease of use and trust in the results of the vote. The use of a low-cost substrate such as paper or plastic, for example in combination with relatively inexpensive printed circuitry, allows for the apparatus to be economically manufactured. This allows practical usage of the apparatus in large elections having commensurately large numbers of voters, such as national elections.

The ballot circuitry comprises logic circuitry and a plurality of voting circuitry elements, each of which is communicatively coupled with the logic circuitry. The voting elements are associated with voting options. For example, each voting element may be associated with one option for which a vote could be cast, such as an election candidate. The option may be identified on the apparatus by a visual indication, such as a printed identifier (for example a candidate name).

Each voting circuitry element is responsive to a voting operation (e.g. performed by a voter) to change a conductive state of that voting element. The changed conductive state thus indicates that a vote has been cast for the associated voting option.

The logic circuitry is configured to detect the conductive state of each of the plurality of voting elements. The logic circuitry is configured to then transmit, via the communication circuitry and based on the conductive state of each of the plurality of voting circuitry elements, a voting result. For example, the voting result may comprise the voting option or options for which votes have been cast (via the changing of the conductive state of the associated voting circuitry element(s)).

The apparatus thus provides an effective, easy-to-use, ballot apparatus. The self-contained nature of the apparatus allows for effective implementation without the overhead associated with other electronic voting systems. For example, where some comparative examples require an electronic terminal in each voting booth, the present example allows each voter to be presented with the above-described ballot apparatus. They can then cast their vote in a manner analogous to a paper ballot, for example by taking the apparatus to a simple voting booth which is not equipped with electronic infrastructure. The voting result can then later be communicated, for example to a vote-counting device.

Trust in the system is also provided by the similarity to paper ballot methods, in particular where the voting operation is an irreversible (or difficult-to-reverse) physical change such that voters can be confident that their vote will not be modified.

In an example, each voting circuitry element is responsive to the voting operation to increase the conductivity of that voting circuitry element. For example, each voting circuitry element may comprise two electronically disconnected components, which are configured to be connected by the voting operation. This provides an efficient and effective way of recording a voting operation. As a particular example, a voter may connect the electronically disconnected components by conductive ink, for example from a conductive ink pen. Such a voting operation is easy for voters to perform, because of its similarity to usage of a paper ballot. For example, a voting circuitry element may be represented as a visible box which, when filled using the aforementioned pen, causes the electronically disconnected components to become connected. Similarly, a voting circuitry element may be represented as two visible lines which, when connected using the aforementioned pen, causes the electronically disconnected components to become connected.

Alternatively, in other examples, each voting circuitry element is responsive to the voting operation to decrease the conductivity of that voting circuitry element. For example, each voting circuitry element may comprise two electronically connected components, the electronically connected components being configured to be disconnected by the voting operation. Such electronically connected components may be connected via a connecting component, a portion of which is removed during a voting operation. As a particular example, the connecting component may be represented as a visible line or block, which a voter can strike through or scratch away with a stylus or other tool.

In some examples, each voting circuitry element is responsive to the voting operation to change a visual state of that voting circuitry element. For example, the visual state may be changed by way of the aforementioned marking with conductive ink, or removal of part of a connecting component. This provides a visual confirmation to a voter that their vote has been recorded. This also allows a visual backup of a vote count to be performed, in a manner similar to that of a paper ballot. For example, an initial rapid electronic vote count may be performed, followed by a visual count of some or all of the used ballot apparatuses. This allows the efficiency of electronic voting to be combined with the security of paper voting. Voter confidence can be provided by the way the same voting operation causes both the electronic change and the visual change: the visual change indicates that the electronic change has been made.

Various voting systems can be supported by the apparatus. For example, in some systems, the voting result comprises one or more respective individual voting results, each individual voting result being based on the conductive state of one of the plurality of voting circuitry elements. This may be implemented in an election where a voter votes for one or more specific candidates, each of which is represented by a single voting element.

Alternatively or additionally, the voting result may comprise a combined voting result based on the conductive states of two or more of the plurality of voting circuitry elements. For example, different voting elements may represent potential rankings of candidates, such that a voter can indicate a ranked order of voting options (or other, more complicated than the previous example, voting choice). In some examples, such multiple choices (for example a ranked order) may be implemented by having a voter use a different functional ink for each choice, where each functional ink has a different conductivity (which can be measured by the logic circuitry) and/or a different colour (which can be identified during a visual vote count).

In an example, the apparatus comprises a power source configured to receive power from an external power source, and to provide said power to the communication circuitry and the ballot circuitry. For example, the power source may be configured to receive the power from an external source. Such a source may be an antenna (which may also be used for communication) which receives power wirelessly during the process of transmitting the voting result, for example by a near-field communication (NFC) reader. This allows a minimal usage of components in the apparatus, with a commensurate reduction in manufacturing requirements and cost, whilst still providing power to extract the voting result.

In other examples, the power source may be self-contained, such as a battery provided within the apparatus.

In examples, the communication circuitry comprises wireless communication circuitry. This allows efficient extraction of the voting result. For example, the voting result may be read as the ballot apparatus is inserted into a receptacle such as ballot box, by a reader built into the box. This allows for live counting as votes are cast, even if votes are visually hidden (for example by the voting apparatus being folded or inserted into an envelope). Alternatively or additionally, the voting result may be read be a separate (e.g. handheld) reader, which provides an alternative counting method and/or can be used as a manual backup to a reader mounted on/in a ballot box.

More generally, two or more acquisitions of the voting result may be obtained by different methods. One acquisition may be a backup acquisition to act as a cross-check or verification of a primary acquisition. For example, the backup acquisition may be an acquisition of a second copy of the voting result from the logic circuitry, received at a different receiver than the primary acquisition. Alternatively or additionally, the backup acquisition may be a visual inspection of the apparatus to determine which voting circuitry elements have been subject to the voting operation. Voting results can thus be effectively audited, increasing security.

Examples of the present disclosure will now be described with reference to the drawings.

FIG. 1 schematically shows an apparatus 100 according to an example of the present disclosure.

The apparatus comprises a substrate 105 (for example paper or plastic), onto which has been deposited logic circuitry 110, communication circuitry 115, and voting circuitry elements 120a, 120b, 120c. The logic circuitry 110 is communicatively coupled to the communication circuitry 115 and to the voting circuitry elements 120a-120c.

Each voting circuitry element corresponds to a voting option, for which a voter can vote. During a voting operation, a voter changes a conductive state of one or more voting elements 120a-120c, which correspond to their selected voting option(s).

The logic circuitry 110 is configured to detect the conductive state of each of the voting circuitry elements 120a-120c, and to transmit, based on this and via the communication circuitry 115, a voting result. For example, this may be performed as part of a vote-counting process.

An example ballot according to the present disclosure, and a way of casting and recording a vote using the example, will now be described with reference to FIGS. 2A-2C.

Figure 2A:
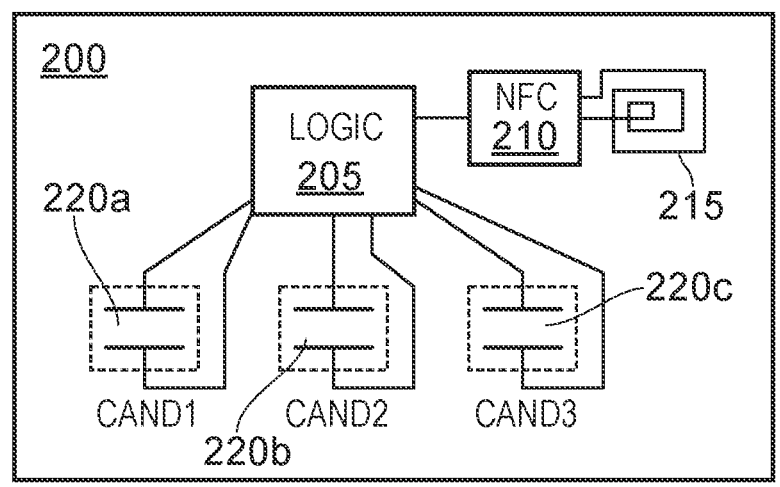
FIGS. 2A to 2C depict a ballot, the casting of a vote using the ballot, and the counting of that vote, according to an example.

FIG. 2A depicts a ballot 200, which may be considered an example of the apparatus 100 described above in relation to FIG. 1.

The ballot 200 comprises a paper substrate, onto which circuitry components and visual components have been deposited, for example by inkjet printing using conductive and visible ink, respectively. In some examples, the conductive ink is also visible.

The circuitry elements include logic circuitry 205, near-field communication (NFC) circuitry 210 and antenna 215, as well as a voting circuitry element for each of three candidates CAND1, CAND2, CAND3. The voting circuitry elements are visually identified by dashed lines and a label for the respective associated candidates. Each voting circuitry element comprises two electrically un-connected terminals, each of which is electronically coupled to the logic circuitry 205.

Figure 2B:
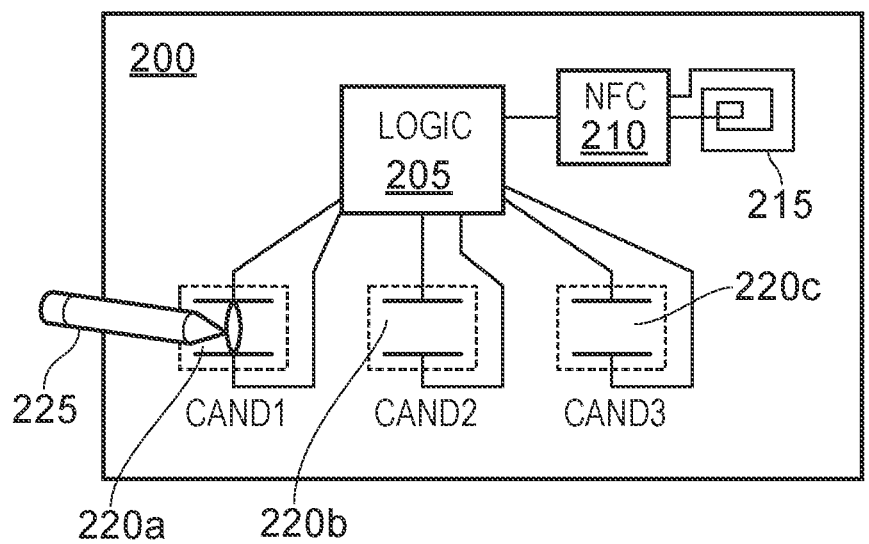

FIG. 2B illustrates how a vote is cast for one of the candidates.

A ballot 200 is provided to each voter, and they cast their vote by using a pen comprising conductive ink to connect the terminals of their chosen candidate. In the example of FIG. 2B, the voter uses conductive pen 225 to vote for CAND1 by connecting the terminals of voting circuitry element 220a. This changes the conductive state of element 220a, such that the circuit connecting element 220a with the logic 205 is completed, whereas the circuits connecting the other elements 220b, 220c with the logic 205 remain broken.

Figure 2C:
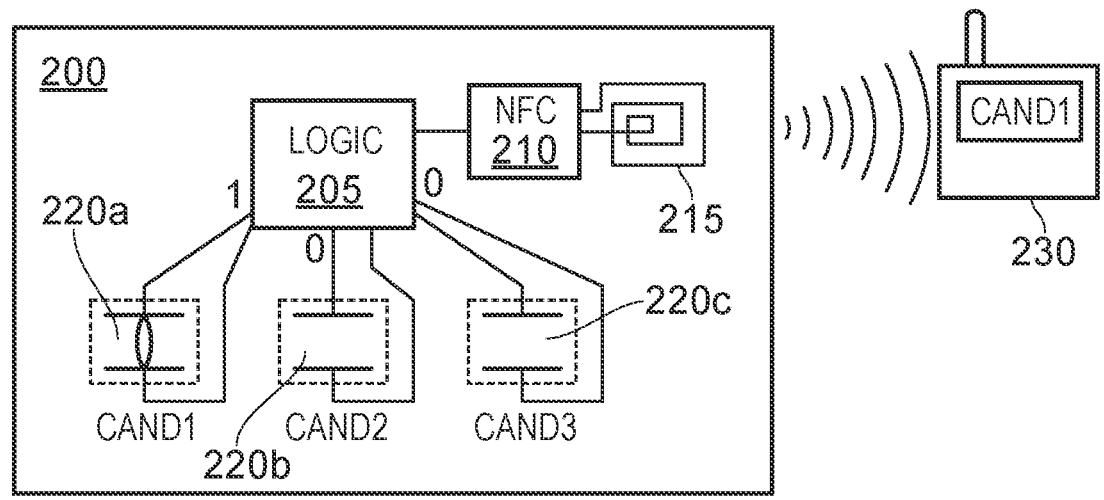

FIG. 2C illustrates how the completed ballot 200 is read. Power is provided to the circuitry (not shown), for example wirelessly via the antenna 215. The logic circuitry determines a voting result based on the conductive state of each voting circuitry element 220a-220c. In this example, the logic 205 determines that element 220a has a complete circuit (shown by "1"), whereas the other elements 220b, 220c have incomplete circuits (shown by "0"). The logic circuitry thus determines that candidate CAND1 has been voted for and directs NFC circuitry 210 to transmit the voting result, via the antenna 215, to vote reading device 230. The vote reading device 230 may be an NFC terminal which also provides the aforementioned power to the ballot 200.

The ballot 200 can thus be efficiently read electronically, via reader 230, such that a large number of cast ballots can be processed. However, the visual ink mark in voting circuitry element 220a also serves as a visual indicator of who has been voted for, which can be used for a backup count or audit, or in the event that an error prevents the ballot 220a from being electronically read. The visual mark also provides a clear indication to the voter that their vote has been securely and irreversibly cast.

As an alternative example, voting circuitry elements may be deposited onto the substrate as respective partially-printed antennas, each of which is reflective at a different frequency and/or amplitude. In this example, when marked by pen 225, a partial antenna becomes complete and the reader 230 can read the vote directly.

Figure 2D:
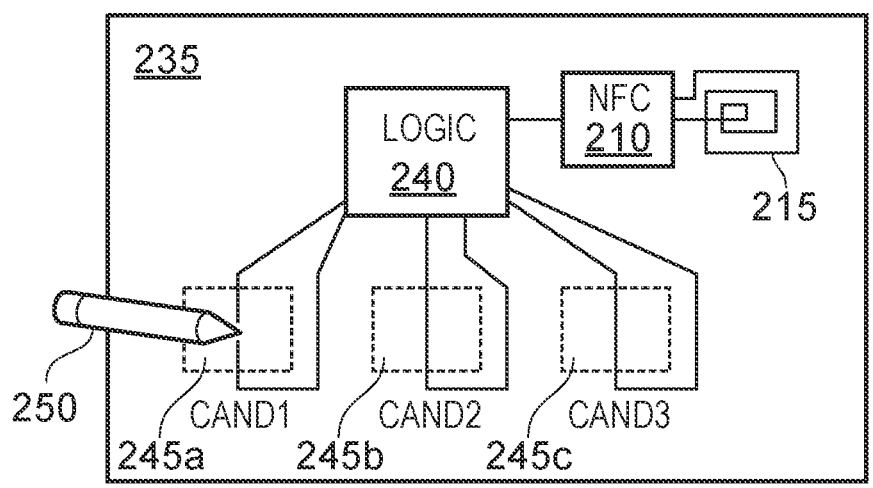
FIG. 2D illustrates the casting of a vote according to an alternative example.

FIG. 2D depicts how a vote may be cast in an alternative example. In this example, ballot 235 comprises logic circuitry 240, NFC circuitry 210 and antenna 215, similarly to ballot 200. Ballot 235 also comprises three voting circuitry elements 245a-245c. However, in contrast to the voting circuitry elements 220a-220c of ballot 200, voting circuitry elements 245a-245c are pre-filled with a conductor. Thus, in the pristine state, each corresponding circuit is complete (whereas voting circuitry elements 220a-220c were incomplete in the pristine state). To cast a vote, a voter uses stylus 250 to break the connection in the voting circuitry element 245a corresponding to their chosen candidate CAND1, for example by scratching off an abradable portion of the conductor. The logic circuitry 240 can then detect a vote as a broken circuit (whereas for ballot 200, a vote is detected as a completed circuit).

A secure, triply-verified method of counting votes cast using ballots 200 will now be described with reference to FIGS. 3A-3C.

Figure 3A:
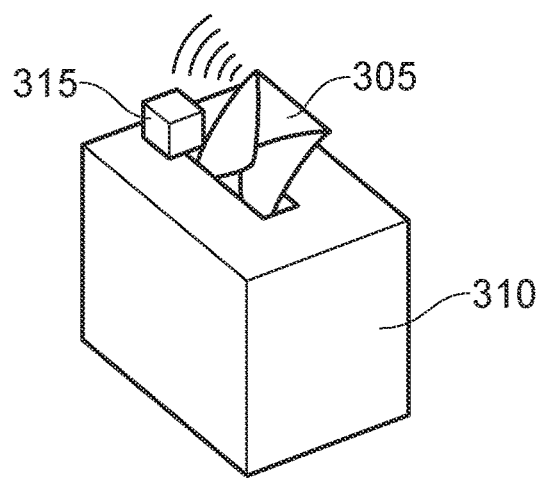
FIGS. 3A to 3C depict three methods of recording votes cast using ballots, according to an example.

FIG. 3A shows a first counting method. The cast ballot 200, sealed within privacy envelope 305, is inserted by the voter into ballot box 310. The ballot box 310 has a built-in NFC reader 315, which reads all ballots 200 as they are inserted. Votes can thus be instantly counted as they are received. The results may be immediately transmitted to a voting centre which aggregates live voting results from multiple ballot boxes at multiple polling stations.

Figure 3B:
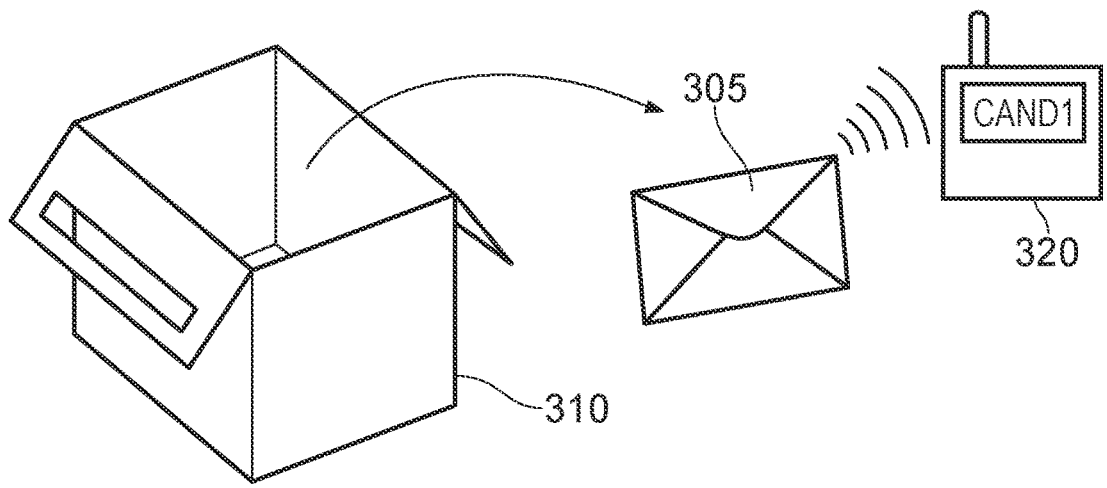
Figure 3C:
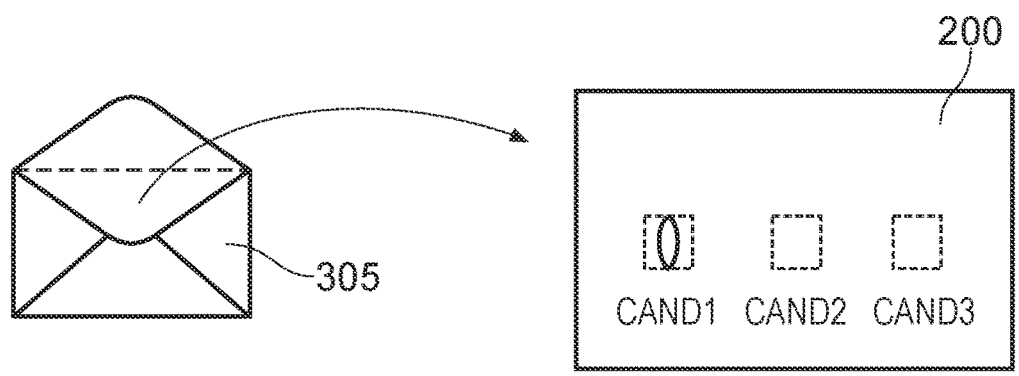

FIG. 3B shows a second counting method, which may for example be performed after voting has closed. The ballot box 310 is opened and sealed ballots 305 are removed. Each ballot is read by NFC reader 320, which may for example be a handheld reader operated by an election official. This allows a backup of the first count, for example to verify the first count. Whilst slower than the first count, the second count is still fast compared to counting of paper ballots, as well as being less prone to human error on the part of the counter because the votes are automatically recorded by the reader 320. In the present example, the reader indicates that the ballot in envelope 320 was cast for candidate CAND1.

Finally, 3C shows a third counting method. This may be performed for a triple verification of the result. In the third counting method, each ballot 200 is removed from its envelope 305 and visually inspected to determine the candidate for which a vote was cast. The votes are then counted in the manner of a paper ballot election.

The second and third counting methods may be employed to double- or triple-check voting results. Such a verification may be desired for all cast ballots or, alternatively, for a subset. For example, a random subset of ballots, or e.g. all ballots from a random selection of ballot boxes 310, may be tested in order to audit the voting results. As another example, double- and/or triple-checking may be employed when additional accuracy is required, for example if an election result is close or if a re-count is ordered.

By way of example, one way of implementing the additional checking is as follows. Firstly, all votes are counted using the first method as they are cast, and then using the second method following the closing of polls. Then, if there is a discrepancy between the first and second methods, or if a re-count is ordered, the third method is employed.

Alternatively or additionally, various methods can be used to resolve a discrepancy between the three counting schemes. For example, a single result (e.g. the result of the third counting method) may be deemed final. Alternatively, a majority voting method may be used such that if two counting schemes agree and one disagrees, the two which are agree are taken as correct.

The present example thus allows a hybrid of electronic and paper voting, providing the advantages of both: the ballots can be efficiently recorded and tallied electronically, whilst still providing the security of a visual mark on a paper ballot if the electronic result is deemed unsatisfactory.

Figure 4:
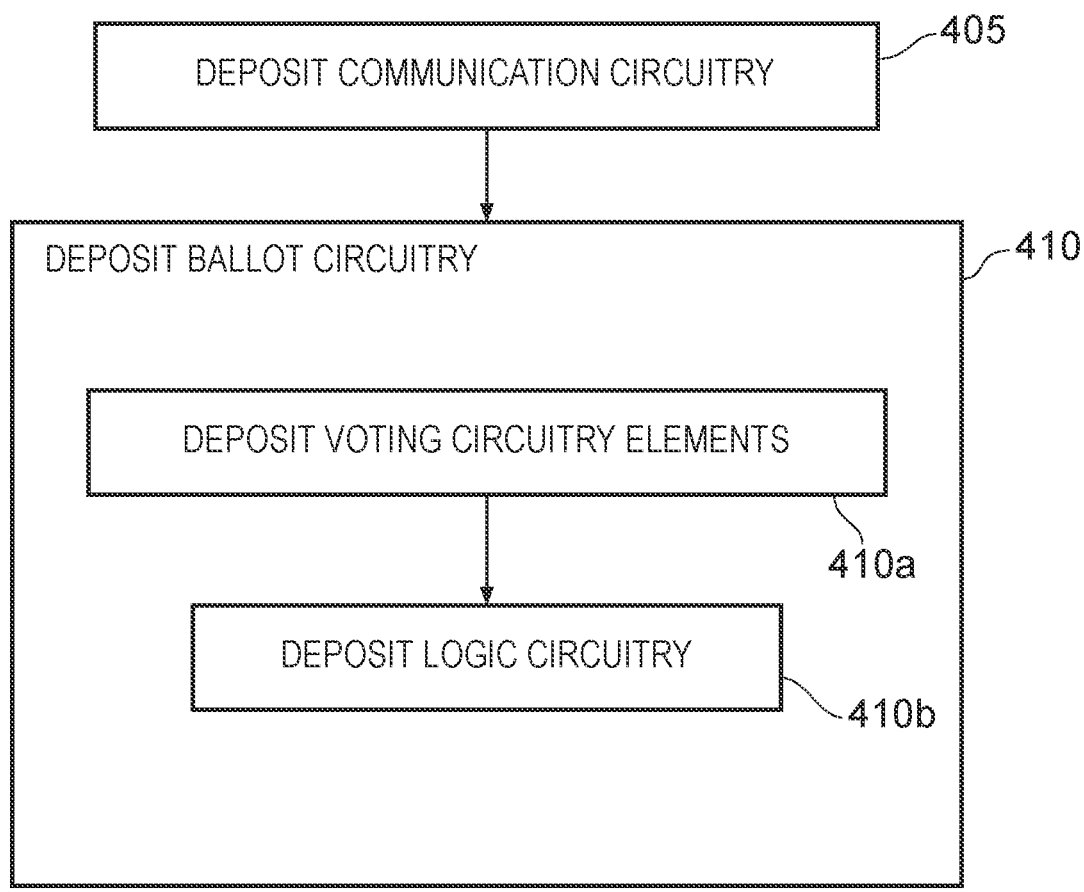
FIG. 4 illustrates a method according to an example.

FIG. 4 schematically depicts a method for manufacturing a ballot 200 according to an example.

At block 405, communication circuitry is deposited (for example by inkjet printing of conductive ink) onto a substrate.

At block 410, ballot circuitry is deposited (which may similarly be by inkjet printing of conductive ink) onto the substrate.

Block 410 comprises sub-steps 410a and 410b. Sub-step 410a comprises depositing a plurality of voting circuitry elements onto the substrate, each voting circuitry element being responsive to a voting operation to change a conductive state of that voting circuitry element.

Sub-step 410b comprises depositing logic circuitry onto the substrate, the logic circuitry being communicatively coupled with each of the plurality of voting circuitry elements. The logic circuitry is configured to detect the conductive state of each of the plurality of voting circuitry elements, and transmit, via the communication circuitry and based on the conductive state of each of the plurality of voting circuitry elements, a voting result.

The method thus allows a ballot 200, as described above, to be manufactured. The described steps 405, 410a and 410b may be performed in any order.

Apparatuses and methods are thus provided for ballots which are efficiently countable whilst being secure.

From the above description it will be seen that the techniques described herein provides a number of significant benefits. In particular, the advantages of electronic and paper ballots are combined.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope of the invention as defined by the appended claims.

We claim:

1. An apparatus, the apparatus being a ballot sheet comprising:
   a flexible substrate;
   communication circuitry comprising flexible electronics deposited on the flexible substrate; and
   ballot circuitry deposited on the flexible substrate, the ballot circuitry comprising:
      a plurality of voting circuitry elements, each voting circuitry element being responsive to a voting operation to change a conductive state of that voting circuitry element; and
      logic circuitry communicatively coupled with each of the plurality of voting circuitry elements and with the communication circuitry, the logic circuitry being configured to:
         detect the conductive state of each of the plurality of voting circuitry elements; and
         transmit from the ballot sheet, via the communication circuitry and based on the conductive state of each of the plurality of voting circuitry elements, a voting result.

2. An apparatus according to claim 1, wherein the flexible substrate comprises at least one of paper and plastic.

3. An apparatus according to claim 1, wherein the electronics comprise printed electronics.

4. An apparatus according to claim 1, wherein each voting circuitry element is responsive to the voting operation to increase the conductivity of that voting circuitry element.

5. An apparatus according to claim 4, wherein each voting circuitry element comprises two electronically disconnected components, the electronically disconnected components being configured to be connected by the voting operation.

6. An apparatus according to claim 5, wherein the electronically disconnected components are configured to be connected, during the voting operation, by conductive ink.

7. An apparatus according to claim 1, wherein each voting circuitry element is responsive to the voting operation to decrease the conductivity of that voting circuitry element.

8. An apparatus according to claim 7, wherein each voting circuitry element comprises two electronically connected components, the electronically connected components being configured to be disconnected by the voting operation.

9. An apparatus according to claim 8, wherein:
   the electronically connected components are connected via a connecting component; and
   the electronically connected components are configured to be disconnected, during the voting operation, by removal of at least a portion of the connecting component.

10. An apparatus according to claim 1, wherein the voting result comprises at least one of:
    one or more respective individual voting results, each individual voting result being based on the conductive state of one of the plurality of voting circuitry elements; and
    a combined voting result based on the conductive states of two or more of the plurality of voting circuitry elements.

11. An apparatus according to claim 1, wherein each voting circuitry element is responsive to the voting operation to change a visual state of that voting circuitry element.

12. An apparatus according to claim 1, comprising a power source configured to:
    receive power from an external power source; and
    provide said power to the communication circuitry and the ballot circuitry.

13. An apparatus according to claim 1, wherein the communication circuitry comprises wireless communication circuitry.

14. A method of manufacturing a ballot sheet, the method comprising:
    depositing communication circuitry, comprising flexible electronics, onto a flexible substrate; and
    depositing ballot circuitry onto the flexible substrate, wherein depositing the ballot circuitry comprises:
       depositing a plurality of voting circuitry elements onto the flexible substrate, each voting circuitry element being responsive to a voting operation to change a conductive state of that voting circuitry element; and depositing logic circuitry onto the flexible substrate, the logic circuitry being communicatively coupled with each of the plurality of voting circuitry elements and configured to:

detect the conductive state of each of the plurality of voting circuitry elements; and transmit from the ballot sheet, via the communication circuitry and based on the conductive state of each of the plurality of voting circuitry elements, a voting result.

15. A method according to claim 14, wherein said depositing comprises inkjet printing, with conductive ink, of the communication circuitry and ballot circuitry onto the flexible substrate.

16. A method comprising:

obtaining a ballot sheet, a voting operation having been applied to the ballot sheet, the ballot sheet comprising:

a flexible substrate;

communication circuitry comprising flexible electronics deposited on the flexible substrate; and ballot circuitry deposited on the flexible substrate, the ballot circuitry comprising:

a plurality of voting circuitry elements, each voting circuitry element being responsive to a voting operation to change a conductive state of that voting circuitry element; and logic circuitry communicatively coupled with each of the plurality of voting circuitry elements and with the communication circuitry, the logic circuitry being configured to:

detect the conductive state of each of the plurality of voting circuitry elements; and transmit from the ballot sheet, via the communication circuitry and based on the conductive state of each of the plurality of voting circuitry elements, a voting result, and communicating with the apparatus, via the communication circuitry, to receive a voting result from the logic circuitry.

17. A method according to claim 16, wherein said communicating with the apparatus comprises receiving the voting result at a receiver associated with a receptacle for the apparatus, whilst the apparatus is received into the receptacle.

18. A method according to claim 16, comprising performing at least one backup acquisition of the voting result, via at least one different communication method than said communicating.

19. A method according to claim 18, wherein said at least one different communication method comprises at least one of:

a second communication, via the communication circuitry, to receive a second copy of the voting result from the logic circuitry, said second copy being received at a different receiver than said voting result; and a visual inspection of the apparatus to determine which voting circuitry elements have been subject to the voting operation.

\* \* \* \* \*